United States Patent [19]

Koyama et al.

[11] Patent Number: 5,406,095
[45] Date of Patent: Apr. 11, 1995

[54] LIGHT EMITTING DIODE ARRAY AND PRODUCTION METHOD OF THE LIGHT EMITTING DIODE

[75] Inventors: Yoshihisa Koyama, Yokosuka; Taku Katayama, Yokohama; Katsuhiko Morita, Yokosuka; Masashi Yoshimura, Yokohama; Toshiki Yoshida, Miura; Manabu Endo, Yokohama, all of Japan

[73] Assignee: Victor Company of Japan, Ltd., Yokohama, Japan

[21] Appl. No.: 112,669

[22] Filed: Aug. 26, 1993

[30] Foreign Application Priority Data

Aug. 27, 1992 [JP] Japan ................................. 4-252287
Aug. 31, 1992 [JP] Japan ................................. 4-255862
Aug. 31, 1992 [JP] Japan ................................. 4-255868
Nov. 27, 1992 [JP] Japan ................................. 4-341626

[51] Int. Cl.$^6$ ............................................ H01L 33/00
[52] U.S. Cl. ......................................... 257/88; 257/93; 257/98; 257/103; 257/183
[58] Field of Search ................... 257/88, 93–98, 257/103, 183, 623, 506

[56] References Cited

U.S. PATENT DOCUMENTS

5,260,589 11/1993 Yamauchi et al. .................. 257/88

FOREIGN PATENT DOCUMENTS

59-2382   1/1984  Japan .
61-61458  3/1986  Japan .
62-16583  1/1987  Japan .
1200678   8/1989  Japan .
220076    1/1990  Japan .

OTHER PUBLICATIONS

Journal of Crystal Growth 107(1991) pp. 832–835, 1991, T. Kato et al, "GaAs/GaAlAs surface emitting IR LED with Bragg reflector grown by MOCVD".

Primary Examiner—Mark V. Prenty
Attorney, Agent, or Firm—Michael N. Meller

[57] ABSTRACT

An LED (light emitting diode) array of the present invention has a plurality of light emitting diodes aligned in row on a substrate crystal. Each of the light emitting diodes has a double hetero-structure formed by causing a light emitting layer to be interposed between p-type and n-type semi-conductive layers and is isolated with isolating mesa grooves. A reflecting layer is provided between the substrate crystal and one of the p-type and n-type semi-conductive layers. The reflecting layer comprises a plurality of semi-conductive layers having at least different refractive indexes of 2 or more than 2-kinds, each of the semi-conductive layers made of semiconductor having the same polarity as that of the substrate crystal and having a wider forbidden band width than that of the light emitting layer. Further, the isolating mesa grooves are provided by a wet etching using an etching liquid of $H_3PO_4 \cdot H_2O_2$ having volume ratio of $H_3PO_4: H_2O_2 = 1 \sim 5:1$, thus, the LED array having a high integration and a high light emitting output can be successfully produced.

10 Claims, 11 Drawing Sheets

LIGHT EMITTING DIODE ARRAY AND PRODUCTION METHOD OF THE LIGHT EMITTING DIODE

BACKGROUND OF THE INVENTION

1. Field of the Invention

The present invention relates to a light emitting diode array, in particular, to an improvement of a monolithic light emitting diode array having a plurality of surface light emitting diodes having a mesa structure aligned in row, and to the production method of the light emitting diode array.

2. Description of the Related Art

Presently, in order to utilize light emitting diodes (referred to as LEDs hereafter) as a light source for a printer utilizing a light and for an information writing element of an optical information device, there are proposed or developed many techniques for integrating a plurality of LEDs into a monolithic LED array (referred to as LED array hereafter) in a high integration.

The LED array is provided with an array of LEDs having an integration of, for instance, 300-400 dpi (dots per inch) by causing the LEDs to be lineally aligned in row, however, the LED array is further required to have a higher integration because of demands for downsizing of the light utilizing printer and for a high definition picture of the optical information device.

In order to realize an LED array having an integration of more than 1600 dpi, the LEDs have to be aligned in row at a pitch of less than 16 $\mu$m on a substrate crystal. As a method for electrically isolating the LEDs from each other, there is proposed such a method as providing isolating mesa grooves between the LEDs by using an etching liquid or such a method as diffusing impurity elements to form diffusion areas between the LEDs.

In the above etching method and impurity diffusion method, the isolating mesa grooves and the diffusion areas are spread not only in directions of depths thereof but also in lateral directions thereof, so that the grooves and the diffusion areas have to be formed in the depths of less than 3 $\mu$m. The technique for isolating the LEDs from each other by the impurity diffusion method is disclosed in Japanese Laid-Open Publication 2382/1984.

In the production method of the prior art, at first, a p-type GaAlAs layer and an n-type GaAlAs layer are formed on a substrate crystal in this order by a liquid phase growth method. Thus, a semi-conductive wafer is obtained. Next, after an insulation layer, for instance, of $SiO_2$ is formed on the semi-conductor wafer, one part of the insulation layer is removed by using a photolithography leaving another part thereof corresponding to the light emitting areas. Then, zinc elements are diffused into the n-type GaAlAs layer so as to reach the p-type GaAlAs layer from the surface of the wafer by causing the insulation layer to be a mask, so that p-type isolation areas are formed in the semi-conductive wafer, thus the LED array having a plurality of separated LEDs is obtained. According to the above LED array, it is possible to obtain an LED array having an aligned pitch of less than 50 $\mu$m by causing a thickness of the n-type GaAlAs on which the p-type isolation areas are formed, to be less than 10 $\mu$m.

In the above production method of the LED array, however, it was difficult to obtain the LED array having a high light emitting output because of the impurity diffusion.

Further, it was difficult to obtain the LED array having an adequately small dispersion of light emitting output because a layer having thickness of less than 10 $\mu$m can not be obtained by the liquid phase growth method without dispersion of the thickness thereof, while the liquid phase growth method is suitable to form a layer having a thickness of more than 10 $\mu$m.

Thus, the liquid phase growth method is employed to obtain a semi-conductive wafer having thick films on the substrate crystal. The thick films allow the semi-conductive wafer to remove the substrate crystal by using an etching liquid, so that a conductive layer for an electrode can be directly formed on the thick films after removing the substrate from the semi-conductive wafer. This structure of the LED array is advantageous to preventing the lights emitted from the light emitting areas from being absorbed by the substrate crystal.

Recently, new thin film forming techniques such as an organic metal vapor phase growth method and a molecular beam epitaxial growth method have been developed for forming a semi-conductive layer having a thickness of 5~6 $\mu$m on the substrate crystal, and these techniques have realized a thin film having an uniform thickness because of excellent controllability of the thin film.

These organic metal vapor phase growth method and molecular beam epitaxial growth method have the excellent controllability of the thin films formed on the substrate crystal, however, they are not suitable for forming the thin films having thicknesses of more than 10 $\mu$m on the contrary. Therefore, the conductive layer for electrode of the LED array has to be provided on the surface of the substrate crystal on which the thin films are formed because the thin films formed by the above methods are too thin or mechanically too weak to remove the substrate crystal from the semi-conductive wafer leaving thin films by using an etching liquid. This poses a loss of light emitting output because lights emitted from the diodes are mostly absorbed by the substrate crystal.

Further, in the prior art, in order to form the isolating mesa grooves between the emitting diodes, a mesa etching method using the etching liquid is employed.

When an isolating mesa groove is formed in a direction of a <0 −1 −1> axis of a crystal semi-conductor on a (1 0 0) plane by a mesa etching using HCl liquid, edge angles formed at side walls of the isolating mesa groove have acute angles or negative slopes (the groove having walls of the negative slopes is referred to as a negative-type mesa groove hereafter). On the other hand, when an isolating mesa groove is formed in a direction of a <0 −1 1> axis of the crystal on the (1 0 0) plane by the mesa etching, edge angles formed at side walls of the isolating mesa groove have obtuse angles or positive slopes (the groove having walls of positive slopes is referred to as a positive-type mesa groove hereafter).

Thus, when a direction of the LEDs aligned in row, i.e. a direction of an LED array, is defined in parallel with the <0 −1 1> axis of the crystal, the isolating mesa groove formed in parallel with the direction of the LED array becomes the positive-type mesa groove. On the other hand, a crystal axis vertical to the <0 −1 1> axis becomes a <0 −1 −1>, thus, the isolating mesa grooves for dividing an LED array portion to an individual LED become the negative-type mesa grooves.

As mentioned in the above, the isolating mesa grooves of the LEDs array have the negative-type grooves, thus, the deeper the depths of the negative-type grooves, the smaller the areas at the feet of the LEDs through which a current follows, so that each of the LEDs has a large resistance, which poses a cause of decrease of light emitting output.

Generally, upon a mass-production of the LED arrays, an electrode is formed on a top surface of each of the LEDs by forming an electrode pattern on a wafer made of semi-conductive layer using plasma etching. At first, an electrode layer is provided on the wafer having the isolating mesa grooves provided in advance by evaporating electrode material, then, the electrode layer except for parts provided on the top of LEDs is removed from the wafer by the plasma etching using a mask pattern. At that time, the electrode layer formed on the slopes and parts under the slopes in the negative-type grooves is apt to be left thereon because of shade of the LED portion, which poses a cause of short circuit.
b

SUMMARY OF THE INVENTION

Accordingly, a general object of the present invention is to provide an LED array in which the above disadvantages have been eliminated.

A more specific object of the present invention is to provide an LED array having a high light emitting output by providing a reflecting layer on the side of the substrate crystal, which reflecting layer reflects lights travelling in a direction of a substrate crystal from a light emitting layer.

Another specific object of the present invention is to provide an LED array having a high integration and generating less heat by adopting thin semi-conducting layers constructing a double hereto-structure owing to the provision of the reflecting layer.

Other specific object of the present invention is to provide an LED array having a high light emitting output by employing the reflecting layer having a wide reflective spectrum coverring an entire light wavelength of the lights emitted from the LED array.

Further, other specific object of the present invention is to provide a light emitting diode array comprising, a substrate crystal made of a conductive-type semi-conductor, a plurality of light emitting diodes aligned in row on the substrate crystal, each of the light emitting diodes having a light output surface from which a light is emitted outside, and being isolated with isolating mesa grooves, and having a double hereto-structure formed by causing a light emitting layer having a forbidden band width to be interposed with different conductive-type semi-conductive layers and a reflecting layer provided between the substrate crystal and one of the different conductive-type semi-conductive layers, the reflecting layer comprising a plurality of semi-conductive layers having 2 or more kinds of different refractive indexes, each of the semi-conductive layers made of the same conductive-type semi-conductor as that of the substrate crystal and having a wider forbidden band width than that of the light emitting layer.

Further, other specific object of the present invention is to provide a production method for producing a light emitting diode array, comprising the steps of, forming a reflecting layer and semi-conductive layers having a double hereto-structure on a substrate crystal, providing parallel grooves defined as positive-type mesa grooves in parallel direction with a direction of the light emitting diode array aligned in row and isolating mesa grooves being defined as positive-type mesa grooves for isolating light emitting diodes in the array from each other in a direction vertical to the direction of the light emitting diode array by wet etching using an etching liquid comprising $H_3PO_4 \cdot H_2O_2$ having volume ratio of $H_3PO_4$: $H_2O_2 = 1 \sim 5:1$ and $H_2O$ having a predetermined volume ratio, and providing electrodes on the light emitting diodes.

Other objects and further features of the present invention will be apparent from the following detailed description when read in conjunction with the accompanying drawings.

BRIEF DESCRIPTION OF THE DRAWINGS

Preferred examples of the present invention will be described with reference to the accompanying drawings wherein.

DETAILED DESCRIPTION OF THE PREFERRED EMBODIMENT

First embodiment of the LED array

Figure 1:
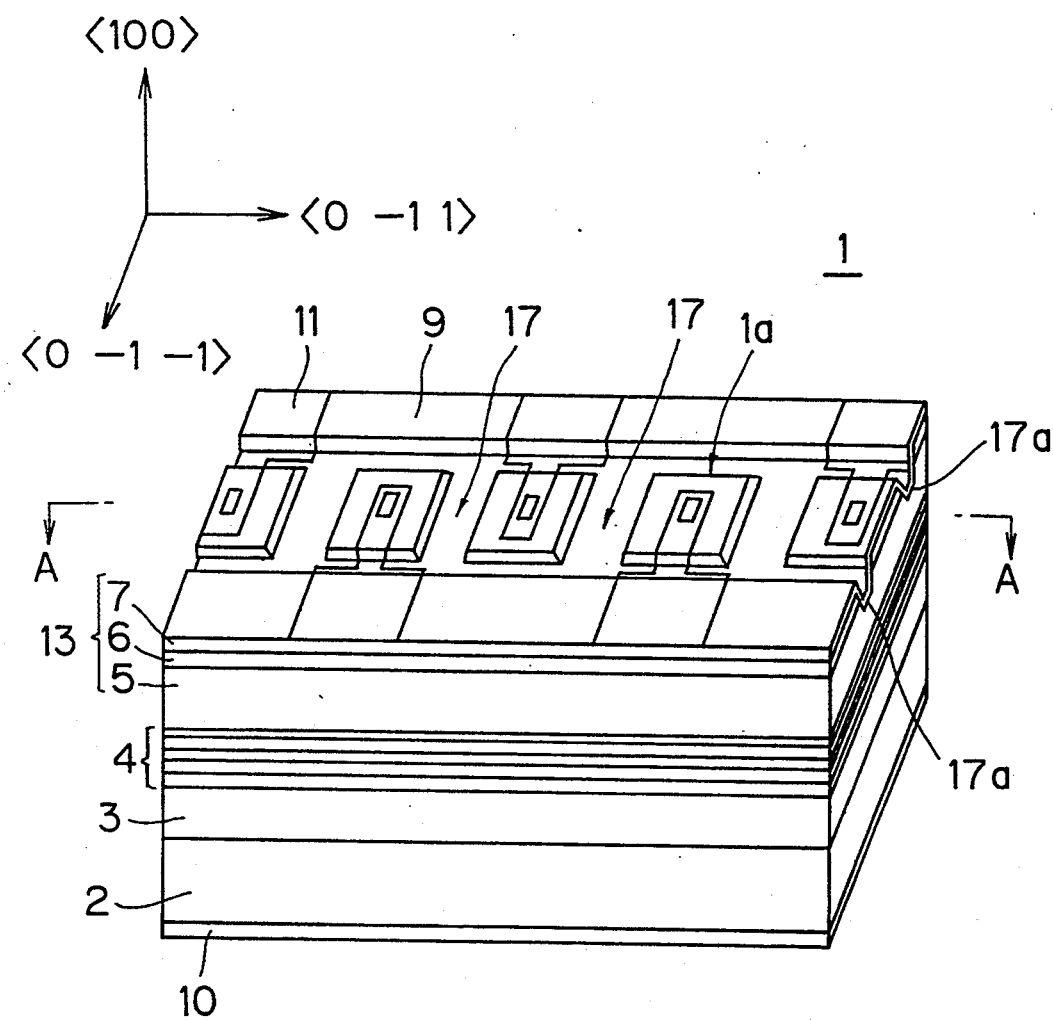
FIG. 1(A) is a perspective view showing a first embodiment of an LED array of the present invention.
FIG. 1(B) is a side sectional view taken along line A—A in FIG. 1(A).
Figure 1B:
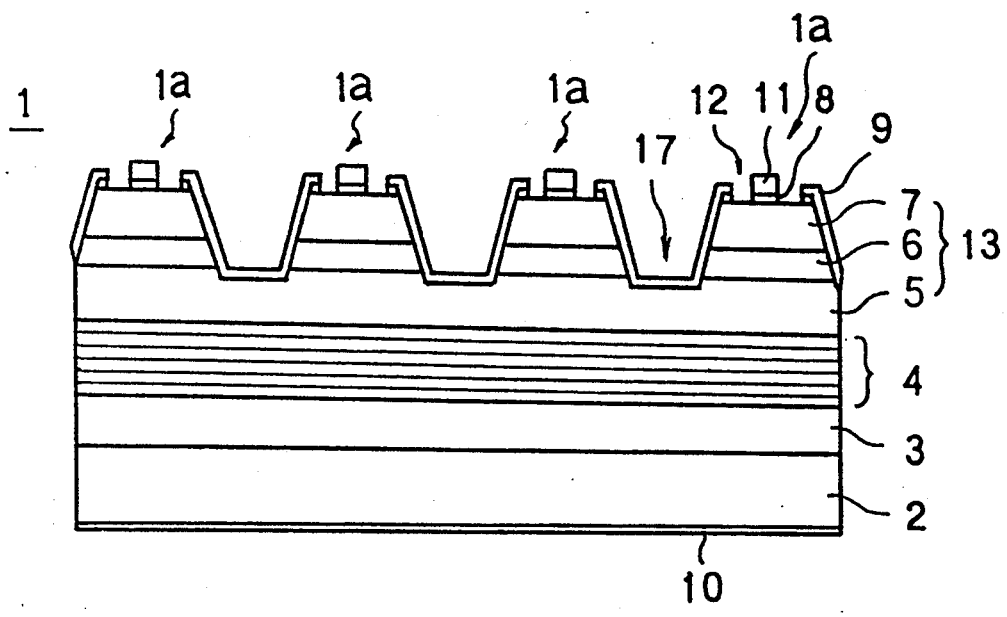

A description is given to a first embodiment of an LED array 1 of the present invention referring to FIGS. 1A and 1B.

FIG. 1(A) is a perspective view showing a first embodiment of an LED array of the present invention.

FIG. 1(B) is a side sectional view taken along line A—A in FIG. 1(A) of the LED array of the present invention. Referring to FIGS. 1(A) and 1(B), the LED array 1 has a plurality of LEDs 1a aligned in row. Each of the plurality of the LEDs 1a comprises an n-type GaAs substrate (referred to as substrate crystal) 2, an n-type GaAs buffer layer 3, a reflecting layer 4, an n-type $Al_{0.7}Ga_{0.3}As$ clad layer 5, a p-type $Al_{0.3}Ga_{0.7}As$ light emitting layer 6, a p-type $Al_{0.7}Ga_{0.3}As$ clad layer 7 and a p-type GaAs cap layer 8. These layers are stacked on the substrate crystal 2 in this order. Positive-type isolating mesa grooves 17 each penetrating partially into the n-type $Al_{0.7}Ga_{0.3}As$ clad layer 5 through the p-type GaAs cap layer 8 are provided between the LEDs 1a, 1a so as to form a plurality of LEDs 1a in row. An SiN insulating layer 9 is formed on the surface of the positive-type isolating mesa groove 17 for protection of the surface thereof. On the p-type cap layer 8 of each of the LEDs 1a and the bottom of the substrate crystal 2 there provided an Al electrode 11 and an AuGeNi electrode 10 respectively. Thus, the LED array of the present invention has a double hereto-structure having the p-type $Al_{0.3}Ga_{0.7}As$ light emitting layer 6 interposed between the n-type and P-type $Al_{0.7}Ga_{0.3}As$ clad layers 5 and 7.

The reflecting layer 4 is made of a plurality semi-conductive layers which have a wider forbidden band width than that of the p-type $Al_{0.3}Ga_{0.7}As$ light emitting layer 6 and the same conductive type as the substrate crystal 2 and different refractive indexes of more than 2 kinds thereof.

In this LED array 1 having the abovementioned structure, when a current is applied across the electrodes 10, 11 of the LED 1a, a light is emitted from the p-type $Al_{0.3}Ga_{0.7}As$ light emitting layer 6 of the corresponding LED respectively. At that time, the light emitted upward from the p-type $Al_{0.3}Ga_{0.7}As$ light emitting layer 6 is output outside from a light output surface 12, on the other hand, the light emitted downward therefrom is reflected by the reflecting layer 4 and also output outward from the light output surface 12 without being absorbed by the substrate crystal 2.

Thus, according to the first embodiment, the LED array 1 having a high light output is obtained.

Further, it is possible to decrease thickness of the semi-conductive layers 13 comprising the double heterostructure, which thickness is proportional to the light output of the LED 1a, because of the high light output of the LED array 1 by providing the reflecting layer 4, which thickness enables a narrower width of the isolating mesa groove 17, thus the LED array 1 having a high integration is obtained.

Next, a description is given to the production method of the LED array 1 referring to FIGS. 2(A)–2(E).

FIGS. 2(A)–2(E) are side cross sectional views each showing a main production process of the first embodiment, taken in the direction of the $<0 -1 -1>$ crystal axis.

At first, an n-type GaAs buffer layer 3 having a thickness of 5 μm is provided on the (1 0 0) plane of an n-type GaAs substrate 2 and a reflecting layer 4 having 25 pairs of stacked layers, each pair comprising an n-type $Al_{0.45}Ga_{0.55}As$ layer having a thickness of 50 nm and an n-type AlAs layer having a thickness of 57 nm, wherein a total thickness d of the n-type GaAs buffer layer 3 is chosen so that a central wavelength of the reflection thereof is approximately the same as a central wavelength of a peak light output of the LED 1a.

Generally, this thickness d of the reflection layer 4 is given as follows:

$$d = \lambda p/(4n) \quad (1)$$

wherein n: a refractive index of the reflecting layer, λp: the central wavelength.

In other words, the thickness d thereof is determined according to the center wavelength of the light emitted from the LED. Further, the maximum reflection of the reflecting layer 4 made of the plurality of pairs of the n-type $Al_{0.45}Ga_{0.55}As$ layer and the n-type AlAs layer can be increased by causing the number of the pairs to increase.

In this embodiment, 25 pairs of the stacked layers are employed according to experimental results.

Next, an n-type $Al_{0.7}Ga_{0.3}As$ clad layer 5 having a thickness of 5 μm, a p-type $Al_{0.3}Ga_{0.7}As$ light emitting layer 6 having a thickness of 0.5 μm, a p-type $Al_{0.7}Ga_{0.3}As$ clad layer 7 having a thickness of 2 μm and a p-type GaAs cap layer 8 having a thickness of 0.1 μm are respectively formed on the reflecting layer 4 in this order by the organic metal vapor phase growth method or the molecular beam epitaxial growth method, thus a semi-conductive crystal layer 13 comprising the n-type $Al_{0.7}Ga_{0.3}As$ clad layer 5, the p-type $Al_{0.3}Ga_{0.7}As$ light emitting layer 6 and the p-type $Al_{0.7}Ga_{0.3}As$ clad layer 7, is formed as a double hereto- structure.

Next, a photo-resist pattern layer 14 is deposited on the cap layer 8 so that directions of a pair of grooves 17a, 17a (shown in FIG. 1(A)) for forming the LED array become respectively parallel to the $<0 -1 1>$ axis of the semi-conductive crystal layer 13 and directions of isolating mesa grooves 17 for separating the LED 1a becomes respectively vertical to the $<0 -1 1>$ axis. Next, as shown in FIG. 2(B), the semi-conductive crystal layer 13 having the photo-resistor pattern layer 14 is etched by using an etching liquid of $H_3PO_4 \cdot H_2O_2 \cdot H_2O$ (volume ratio $H_3PO_4:H_2O_2:H_2O = 3:1:50$) so that the grooves 17a, 17a and the isolating mesa grooves 17 reach the n-type $Al_{0.7}Ga_{0.3}As$ clad layer 5 through the p-type GaAs cap layer 8, thus, the grooves 17a provided in the array direction parallel to the $<0 -1 1>$ axis become positive-type mesa grooves and the isolating mesa grooves 17 between the LED in the direction of the $<0 -1 -1>$, i.e. in the direction vertical to the $<0 -1 1>$, become also positive-type mesa grooves.

The reason why the isolating mesa groove 17 and the groove 17a become positive-type mesa groove is based on such an experimental result obtained by the present inventors that when a groove is provided in a semi-conductive material by using the etching liquid of $H_3PO_4 \cdot H_2O_2 \cdot H_2O$, the groove formed in the direction of the $<0 -1 1>$ axis becomes the positive-type mesa groove, however, the groove formed in the direction of the $<0 -1 -1>$ axis becomes the positive-type or negative-type mesa groove according to a p-type or n-type semi-conductor thereof.

It should be noted that the direction of the LED array 1 can also be made to be in the $<0 -1 -1>$ axis direction because the grooves provided in both the directions, i.e. the $<0 -1 -1>$ and $<0 -1 -1>$ axes, become the positive-type mesa grooves as mentioned in the above.

Figure 2:
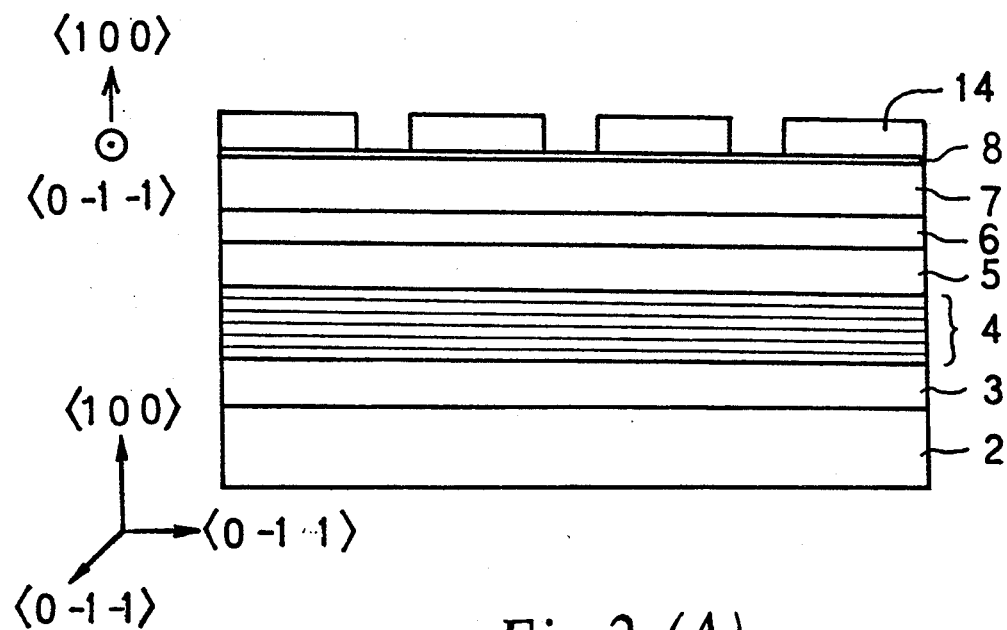
FIGS. 2(A)–2(E) are side cross sectional views each showing a main production process of the first embodiment, taken in the direction of the $<0-1-1>$ crystal axis.
Figure 2:
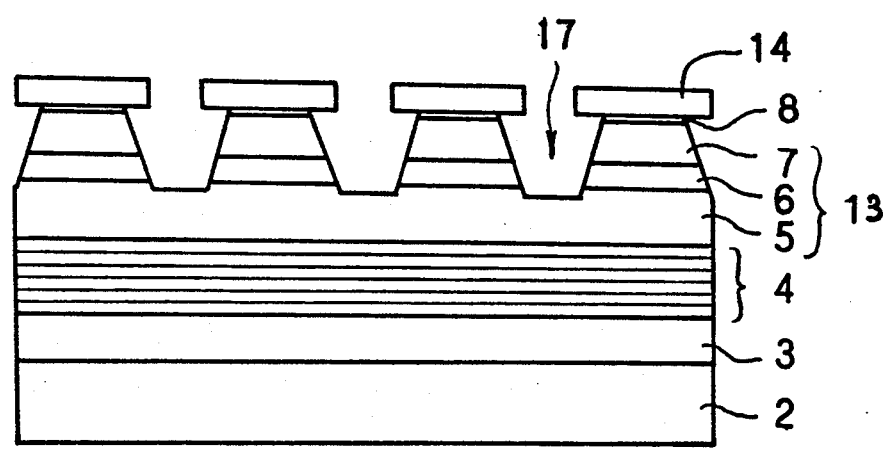
Figure 2:
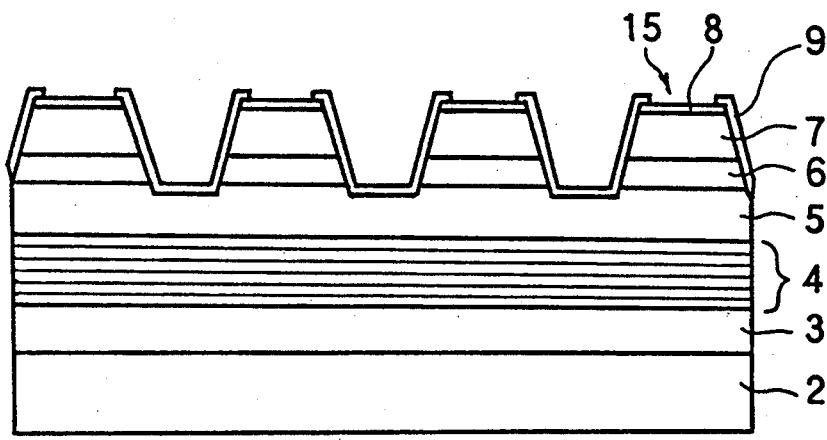
Figure 2:
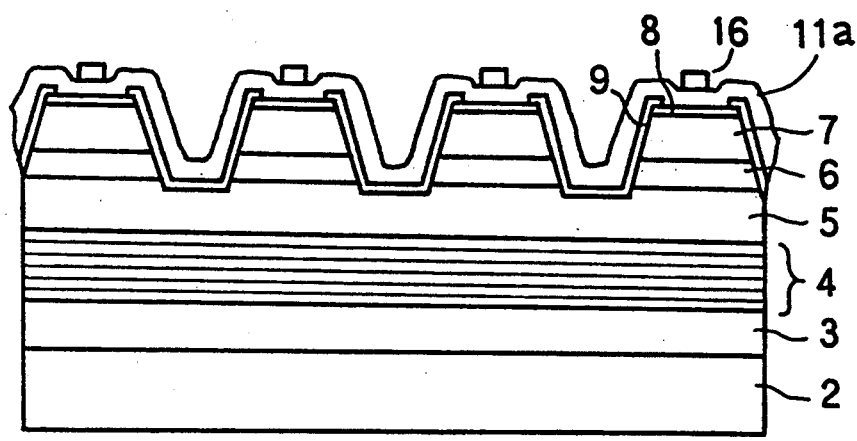
Figure 2:
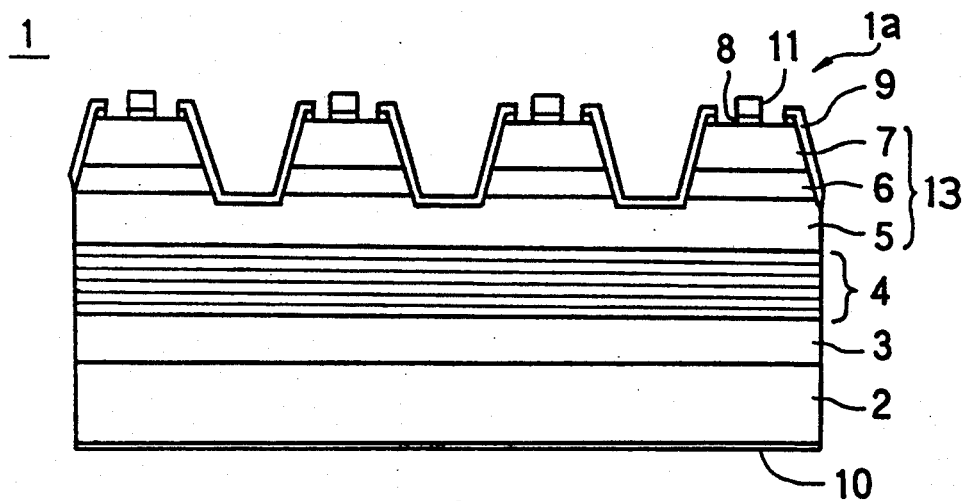

Next, as shown in FIG. 2(C), after removing the photoresist 14, an insulation layer 9 of SiN is formed on the etched surface and the cap layer 8 so as to have a thickness of 0.1 μm, then a contact hole 15 is provided on the cap layer 8 for each of the LEDs by removing a part of the insulation layer 9 by a plasma etching method.

Next, referring to FIG. 2(D), after an Al layer 11a (for p-type Al electrode 11) is deposited thereon so as to have a thickness of 0.5 μm by the vacuum evaporation method, a photo-resist layer 16 having an electrode pattern is formed on the Al layer 11. Then, arrays of p-type Al electrodes 11, are obtained by removing unnecessary parts of the Al layer 11 and the cap layer 8 by plasma-etching using Cl gas and by removing the photo-resist layer 16 after the plasma-etching. Each of the electrodes 11 is led outside across the positive-type mesa grooves as shown in FIG. 1(A).

Next, referring to FIG. 2(E), after grinding a bottom of the substrate crystal 2, an n-type electrode 10 is formed thereon so as to have a thickness of 0.5 μm by evaporating an AuGeNi alloy. Thus, the LED array 1 shown in FIGS. 1(A) and 1B as well as in FIG. 2(D) is obtained.

Generally, in order to narrow the pitch between the LEDs in an LED array, it is required that the depth of the isolating mesa grooves is to be shallower, i.e. the thickness of the semi-conductive layers 13 having the double hetero- structure is to be thinner, thus, this requires a precise thin layer control in production.

In the above embodiment, the semi-conductive layer 13 can be formed with the thickness of 20 μm by using the organic metal vapor phase growth method or the molecular beam epitaxial growth method.

Second embodiment of the LED array

Figure 3:
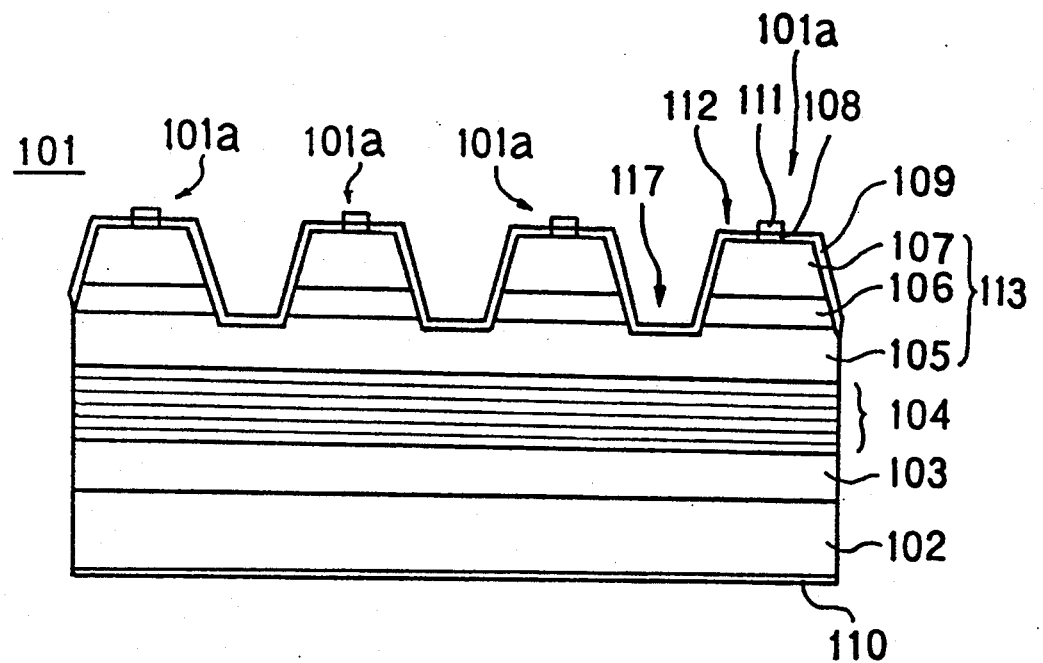
FIG. 3 is a side sectional view showing a second embodiment of a LED array of the present invention.

A description is given to a second embodiment of an LED array of the present invention referring to FIG. 3.

FIG. 3 is a side sectional view showing a second embodiment of a LED array.

A feature of the second embodiment is that a reflection preventing layer 109 is provided on isolating mesa grooves 117 and a light emitting surface 112 except for electrodes 111 instead of the SiN insulation layer 9 of the LED array 1 of the first embodiment, wherein a numeral 102 designates an n-type GaAs substrate (referred to as substrate crystal), 103 an n-type GaAs buffer layer, 104 a reflecting layer, 105 an n-type $Al_{0.7}Ga_{0.3}As$ clad layer, 106 a p-type $Al_{0.3}Ga_{0.7}As$ GaAs light emitting layer, 107 a p-type $Al_{0.7}Ga_{0.3}As$ clad layer, 108 a p-type GaAs cap layer, and 117 positive-type isolating mesa grooves.

In the LED array 1 of the first embodiment shown in FIG. 1, a refractive index is discontinuous at a boundary surface between an outside and an inside of the semi-conductive crystal surface, so that a loss of the light output occurs because the light reflected by the boundary surface interfere with the lights emitted from the p-type $Al_{0.3}Ga_{0.7}$ As light emitting layer 106. The reflection preventing layer 109 in this embodiment, is provided to prevent the light from being reflected by the boundary surface 112 by utilizing light wave interference.

The reflection preventing layer 109 is formed with SiN by a vapor phase growth method so as to have a thickness d satisfying following conditions:

$$d=(2m-1)\cdot \lambda p/(4\cdot n) \quad (2)$$

wherein d: the thickness of the reflection preventing layer 109, m: a positive integer, λp: a center wavelength of the light emitted from an LED 101a and n: a refractive index of the reflection preventing layer 109.

When the thickness d of the reflection preventing layer 109 is determined according to the above condition (2), the light having a center wavelength λp is efficiently output outward, i.e. the light is prevented from being reflected by providing the reflection preventing layer 109 on the light output surface 112 of the LED 101a.

Figure 4:
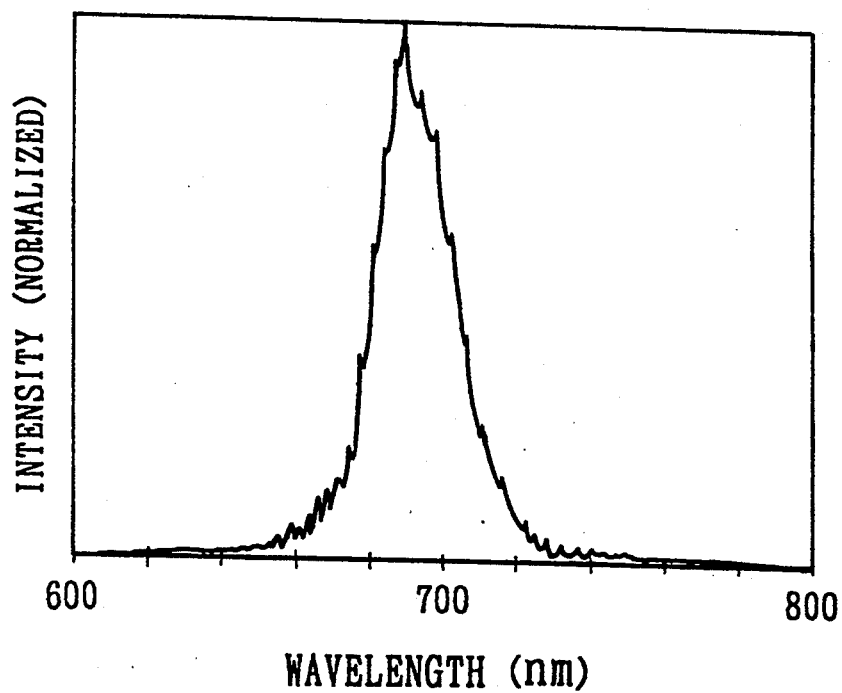
FIG. 4 is a graph of emission spectrum of the LED array of the second embodiment.

FIG. 4 is a graph of emission spectrum of the LED array of the second embodiment.

Figure 5:
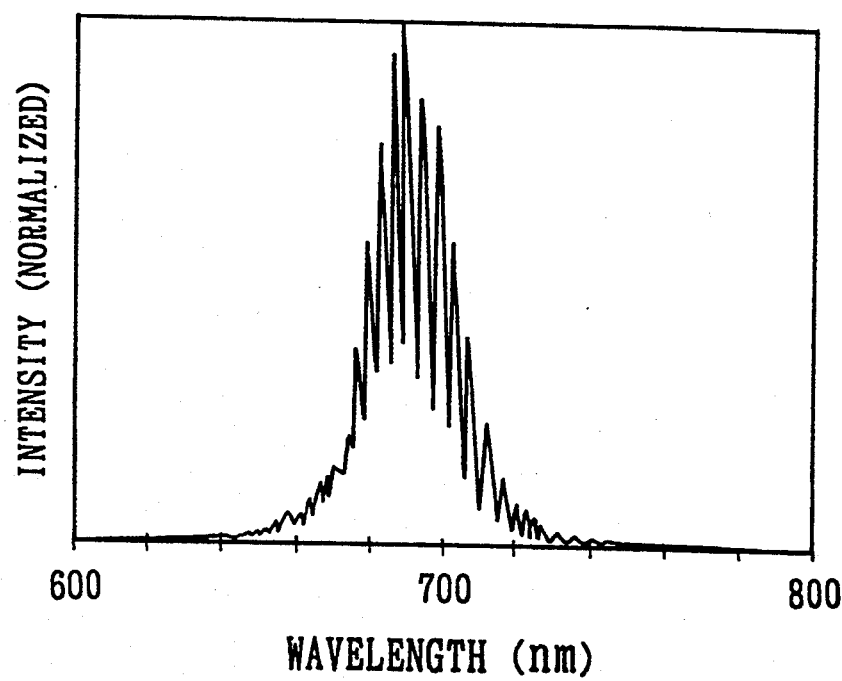
FIG. 5 is a graph of emission spectrum of the LED array of the first embodiment.

FIG. 5 is a graph of emission spectrum of the LED array of the first embodiment.

As seen from FIGS. 4 and 5, in the LED array 101 of the second embodiment, the periodic loss of the light output with respect to the wavelength is minimized compared with that of the LED array 1 of the first embodiment. Thus, the reflected light from the light output surface 112 can be reduced to the minimum and the light emitting efficiently of the LED array 101 can be increased by providing the reflection preventing layer 109 on the light output surface 112.

Further, in the second embodiment, the reflection preventing layer 109 is provided not only on the light output surface 112 but also on the isolating mesa grooves 17, thus, it serves as an antioxidant layer for the semi-conductive layers forming the LED array 101.

Third embodiment of the LED array

Figure 6:
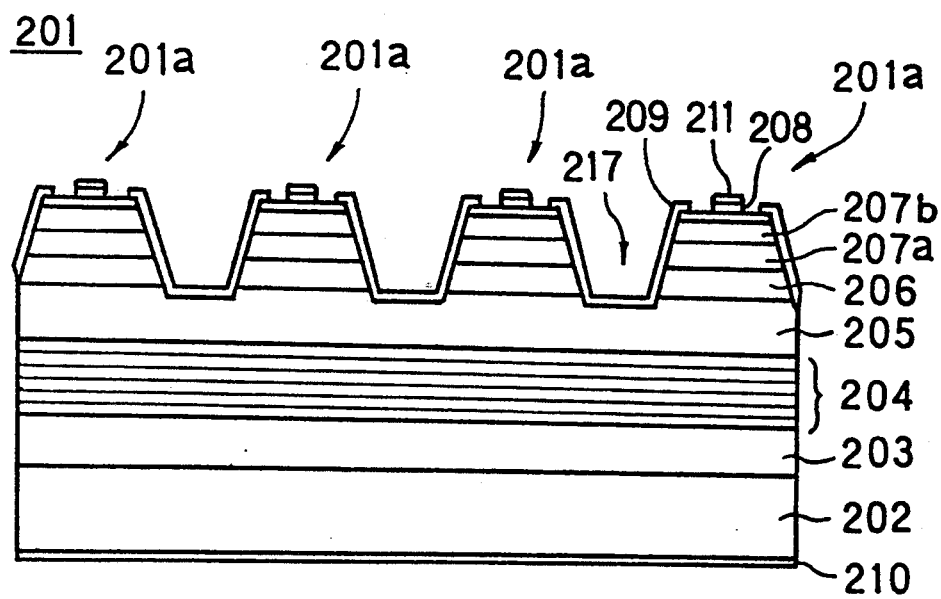
FIG. 6 is a side sectional view of a third embodiment of a LED array of the present invention.

Next, a description is given to a third embodiment of an LED array 201 referring to FIG. 6.

FIG. 6 is a side sectional view of a third embodiment of an LED array of the present invention.

A feature of the LED array 201 of this third embodiment is that an upper portion of the p-type $Al_{0.7}Ga_{0.3}As$ clad layer 7 of the first embodiment, i.e. a contact portion with the p-type GaAs cap layer 8, has higher impurity concentration.

In other wards, in the LED array 201 of this embodiment, two layers comprising a lower impurity concentration clad layer 207a of a p-type $Al_{0.7}Ga_{0.3}As$ layer having an impurity concentration of $8 \times 10^{17}$ cm$^{-3}$ and a higher impurity concentration clad layer 207b of a p$^+$-type $Al_{0.7}Ga_{0.3}As$ layer having a higher impurity concentration of $3 \times 10^{18}$ cm$^{-3}$ by being diffused with Zn are provided between a p-type $Al_{0.3}Ga_{0.7}As$ light emitting layer 206 and a p-type GaAs cap layer 208 as shown in FIG. 6, wherein a numeral 202 designates an n-type GaAs substrate (referred to as substrate crystal), 203 an n-type GaAs buffer layer, 204 a reflecting layer, 205 an n-type $Al_{0.7}Ga_{0.3}As$ clad layer, 210, 211 an electrode, and 217 positive-type isolating mesa grooves.

The impurity concentration and the thickness of the above lower and higher impurity concentration clad layers 207a and 207b are determined depending on the application of the LED array.

The above two layers 207a and 207b are formed by the organic metal vapor phase growth method or the molecular beam epitaxitial growth method used as well as in the first embodiment.

The lower impurity concentration clad layer 207a has almost the same impurity concentration and conductivity as the first and second embodiments. Therefore, when a current is applied to the LED 201a, the current is diffused into the lower impurity concentration clad layer 207a, so that the emitting area of the light emitting layer 206 is extended. Thus, a high light output is obtained from the light emitting layer 206.

Further, the higher impurity concentration clad layer 207b has higher impurity concentration and conductivity than those of the lower impurity concentration clad layer 207a, thus, when a current is applied to the LED 201a, no heat is generated from the higher impurity concentration clad layer 207b, which effectively decreases overall heat generation from the LED array 201.

The decrease of overall heat generation from the LED array 201 enables realizing an LED array having a high light output and a high integration.

It is noted that the lower impurity concentration clad layer 207a and the n-type $Al_{0.7}Ga_{0.3}As$ clad layer 205 have approximately the same impurity concentration and conductivity as those of the first and second embodiments.

Fourth embodiment of the LED array

Figure 7:
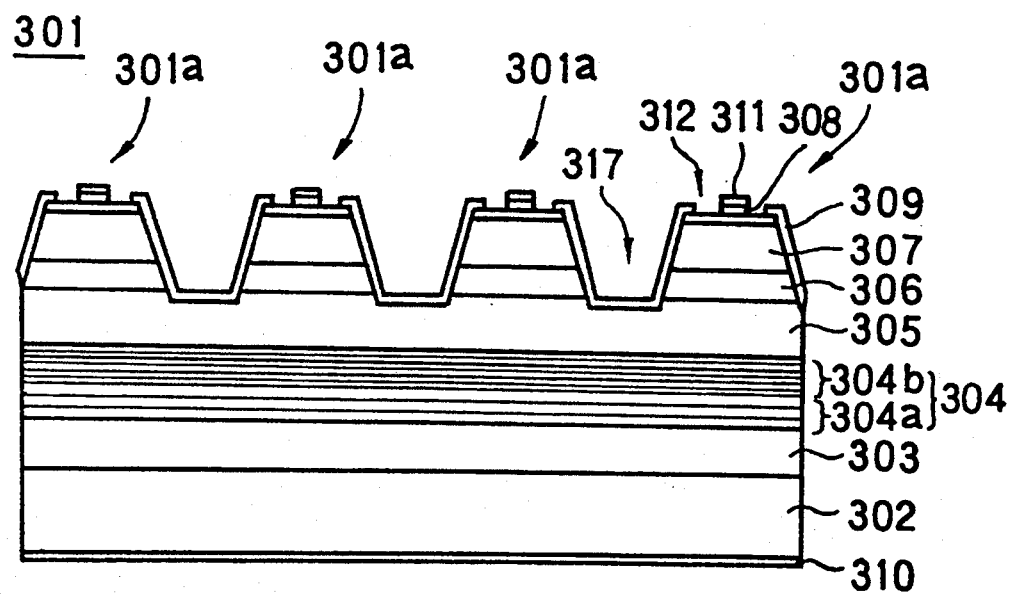
FIG. 7 is a side sectional view of a fourth embodiment of the LED array of the present invention.

Next, a description is given to a fourth embodiment of the LED array 301 referring to FIG. 7.

FIG. 7 is a side sectional view of a fourth embodiment of the LED array of the present invention. Referring to FIG. 7, a feature of the LED array 301 of the fourth embodiment is that a multiplexed reflecting multilayer 304 is provided on an n-type GaAs buffer layer 303 instead of the reflecting layer 4 in the LED array 1 of the embodiment 1 shown in FIG. 1, wherein a numeral 302 designates an n-type GaAs substrate (referred to as substrate crystal), 308 an n-type GaAs buffer layer, 305 an n-type $Al_{0.7}Ga_{0.3}As$ clad layer, 306 a p-type $Al_{0.3}Ga_{0.7}As$ GaAs light emitting layer, 307 a p-type $Al_{0.7}Ga_{0.3}As$ clad layer, 808 a p-type GaAs cap layer, and 317 positive-type isolating mesa grooves.

The multiplexed reflecting multilayer 304 comprises a first reflecting multilayer 304a made of plural semi-conductive layers of different kind materials having different refraction indexes, of which layer thicknesses are intentionally changed, and a second reflecting multilayer 304b made of plural semi-conductive layers of the same kind materials as the first reflecting multilayer 304a and each of the semi-conductive layer thereof has a different thickness from those of the first reflecting multilayer 304a.

For instance, the first reflecting multilayer 304a is made by stacking 25 layer pairs, of which each pair comprises an $Al_{0.35}Ga_{0.65}As$ semi-conductive layer having a thickness of 53 nm and an $Al_{0.8}Ga_{0.2}As$ semi-conductive layer having a thickness of 57 nm, and the second reflecting multilayer 304b is provided by stacking 25 layer pairs of which each pair comprises an $Al_{0.35}Ga_{0.65}As$ semi-conductive layer having a thickness of 48 nm and an $Al_{0.8}Ga_{0.2}As$ semi-conductive layer having a thickness of 53 nm, wherein a refraction index of the $Al_{0.35}Ga_{0.65}As$ semi-conductive layer is different from that of the $Al_{0.8}Ga_{0.2}As$ semi-conductive layer.

The first and second reflecting multilayers 304a and 304b respectively have a reflecting center wavelength of 720 nm and that of 687 nm because the thickness of each of components of the first reflecting multilayer 304a is different from that of each of components of the second reflecting multilayer 304b.

Figure 8:
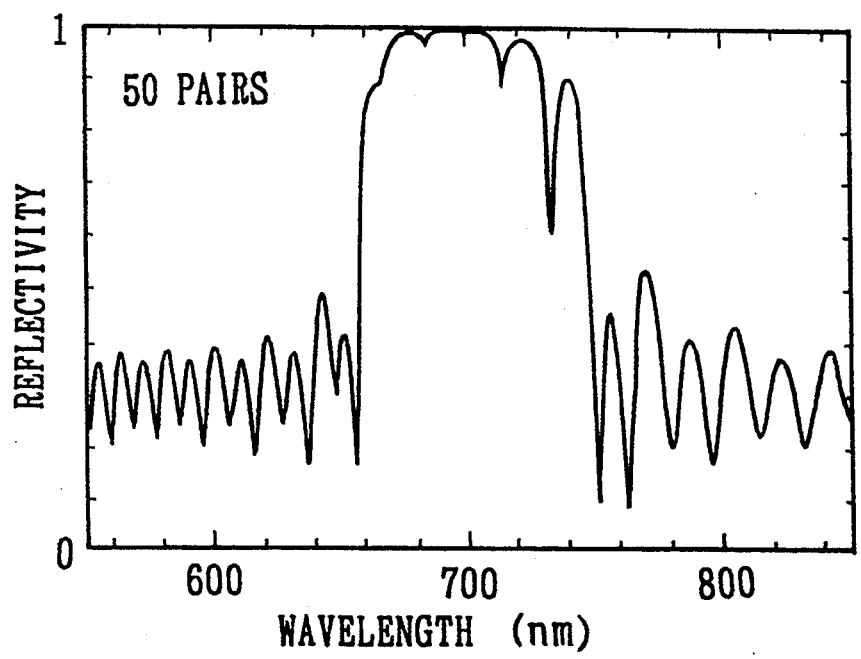
FIG. 8(A) is a graph showing a reflective spectrum of the multiple reflecting multilayer of the LED array of the fourth embodiment.
FIG. 8(B) is a graph showing a reflective spectrum of the reflecting layer of the LED array of the first embodiment.
Figure 8:
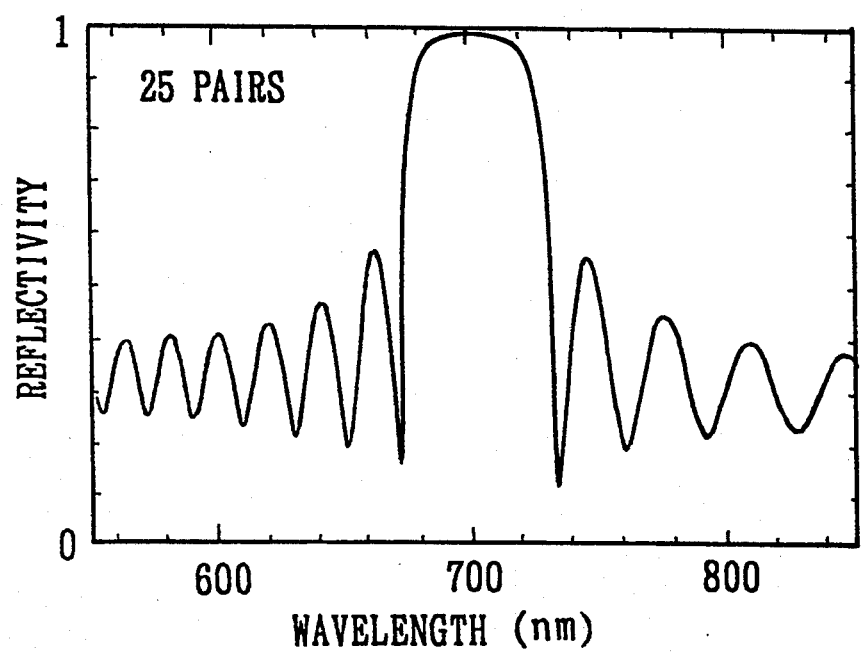

FIG. 8(A) is a graph showing a reflecting spectrum of the multiplexed reflecting multilayer 304 of the LED array 301 of the fourth embodiment.

FIG. 8(B) is a graph showing a reflective spectrum of the reflecting layer 4 of the LED array 1 of the first embodiment.

As seen from FIGS. 8(A) and 8(B), in a reflective spectrum of the multiplexed reflecting multilayer 304 of the LED array 301, the reflective spectrum thereof has a wider half width of 90 nm at a reflective center wavelength of 700 nm compared with that of the LED array 1 of the first embodiment shown in FIG. 1 at the reflective center wavelength of 700 nm. Thus, it will be understood that the reflective spectrum of the multiplexed reflecting multilayer 304 has a combined the reflective spectrums of the first and second reflecting multilayers 304a and 304b. At that time, the thickness d of the first or second reflecting multilayer 304a or 304b is determined by the condition $$d = \lambda p / (4n) \quad (1)$$

as mentioned in the foregoing.

In addition, each thickness d of the first and second reflecting multilayers 304a and 304b is chosen so that the composed reflective spectrum forms a flat top at the most intensive reflecting part when both the first and second reflecting multilayers 304a and 304b are provided as the multiplexed reflecting multilayer 304.

Thus, it is possible for the LED array 301 to increase the light output in a whole wavelength range of the light emitted from the light emitting layer 306 thereof.

Further, a degradation of the light output does not occur in spite of a deviation of thickness of the multiplexed reflecting multilayer 304 in a production process because of the wider half width of spectrum range.

It is noted that in this embodiment, a double reflecting multilayers is employed as the multiplexed reflecting multilayer 304, however, it is possible to employ a multiplexed reflecting multilayer having more than two reflecting multilayers by causing a reflective center wavelength of each of the reflecting multi layers to be different from each other, so that a multiplexed reflecting multilayer having a wider half width of spectrum range can be obtained.

Fifth embodiment of the LED array

Figure 9:
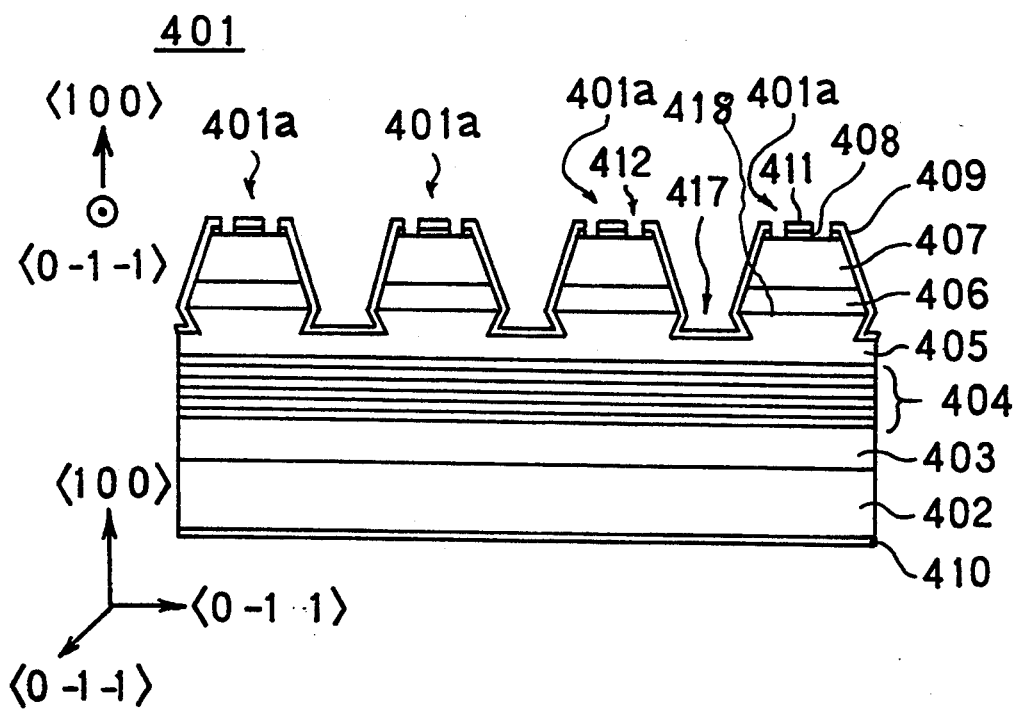
FIG. 9 is a side sectional view showing a fifth embodiment of the LED array of the present invention

Next, a description is given to a fifth embodiment of the LED array 401 of the present invention referring to FIG. 9.

FIG. 9 is a side sectional view showing a fifth embodiment of the LED array.

The feature of the fifth embodiment of the LED array 401 is that in the first embodiment of the LED array 1, the isolating mesa groove 17 thereof is provided so as to penetrate partially into the n-type $Al_{0.7}Ga_{0.3}As$ clad layer 5 by etching.

Referring to FIG. 9, an isolating mesa groove 417 formed in the LED array 401 of the fifth embodiment comprises a positive-type mesa groove from a light output surface 412 to a p-n junction plane 418 formed between a p-type $Al_{0.3}Ga_{0.7}As$ light emitting layer 406 and a p-type $Al_{0.7}Ga_{0.3}As$ clad layer 407, and a negative-type mesa groove penetrating from the p-n junction plane 418 into a part of an n-type $Al_{0.7}Ga_{0.3}As$ clad layer 405, wherein a numeral 402 designates an n-type GaAs substrate (referred to as substrate crystal), 403 an n-type GaAs buffer layer, 404 a reflecting layer, 406 a p-type $Al_{0.3}Ga_{0.7}As$ GaAs light emitting layer, 407 a p-type $Al_{0.7}Ga_{0.3}As$ clad layer, 408 a p-type GaAs cap layer, and 410, 411, electrodes. On the other hand, a groove formed parallel to the array direction of the <0 −1 1> axis has a positive-type mesa groove.

The abovementioned configuration of the isolating mesa groove 417 is based on such an experimental result obtained by the present inventors that when a groove is formed in a semi-conductive material by using the etching liquid of $H_3PO_4 \cdot H_2O_2 \cdot H_2O$, the groove formed in the direction of the <0 −1 1> axis becomes the positive-type mesa groove, however, the groove formed in the direction of the <0 −1 −1> axis becomes the positive-type or negative-type mesa groove according to a p-type or n-type semi-conductor thereof as mentioned in the foregoing.

Thus, when each of the isolating mesa grooves 417 is formed in the direction of the <0 −1 −1> axis by using the etching liquid of $H_3PO_4 \cdot H_2O_2 \cdot H_2O$, a part of the isolating mesa groove 417 penetrating from a light output surface 412 into a p-n junction plane 418 formed between a p-type $Al_{0.3}Ga_{0.7}As$ light emitting layer 406 and the p-type $Al_{0.7}Ga_{0.7}As$ clad layer 407 becomes the positive-type mesa groove, and another part of the isolating mesa groove 417 penetrating from the p-n junction plane 418 into the part of the n-type $Al_{0.7}Ga_{0.3}As$ clad layer 405 becomes the negative-type mesa groove. Thus, a drain of the p-n junction plane 18 becomes the widest, which is advantageous to increase the light output because of a low resistance of the p-n junction plane 418, and to decrease the heat generated therefrom.

Sixth embodiment of the LED array

Figure 10:
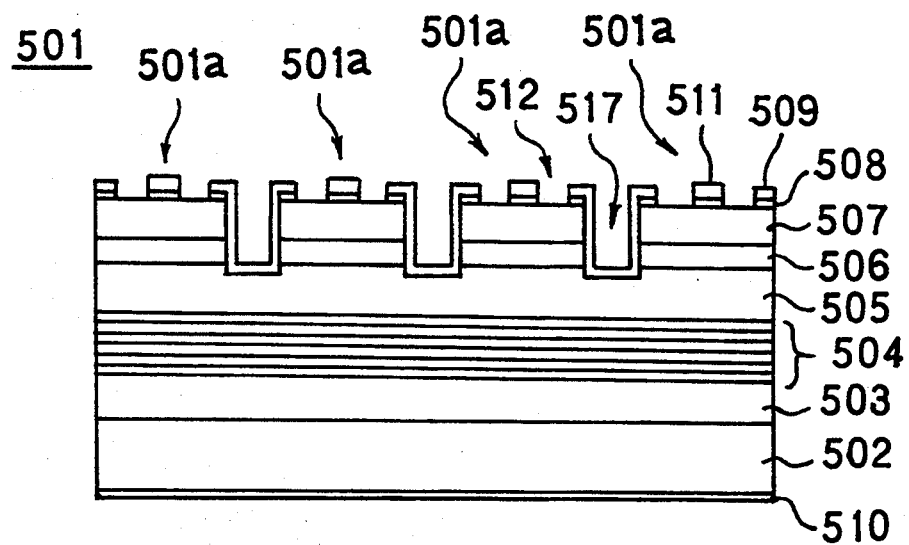
FIG. 10 is a side sectional view showing the sixth embodiment of the LED array of the present invention.

Next, a description is given to a sixth embodiment of the LED array 501 referring to FIG. 10.

FIG. 10 is a side sectional view showing the sixth embodiment of the LED array.

The feature of the sixth embodiment of the LED array 501 is that in the first embodiment of the LED array 1, the isolating mesa groove 17 thereof is provided so as to have a vertical wall.

Referring to FIG. 10, an isolating mesa groove 517 of the sixth embodiment of an LED array 501 has a vertical wall, wherein a numeral 502 designates an n-type GaAs substrate (referred to as substrate crystal), 503 an n-type GaAs buffer layer, 504 a reflecting layer, 505 an n-type $Al_{0.7}Ga_{0.3}As$ clad layer, 506 a p-type $Al_{0.3}Ga_{0.7}As$ GaAs light emitting layer, 507 a p-type $Al_{0.7}Ga_{0.3}As$ clad layer, 508 a p-type GaAs cap layer, and 510, 511, electrodes.

Figure 11:
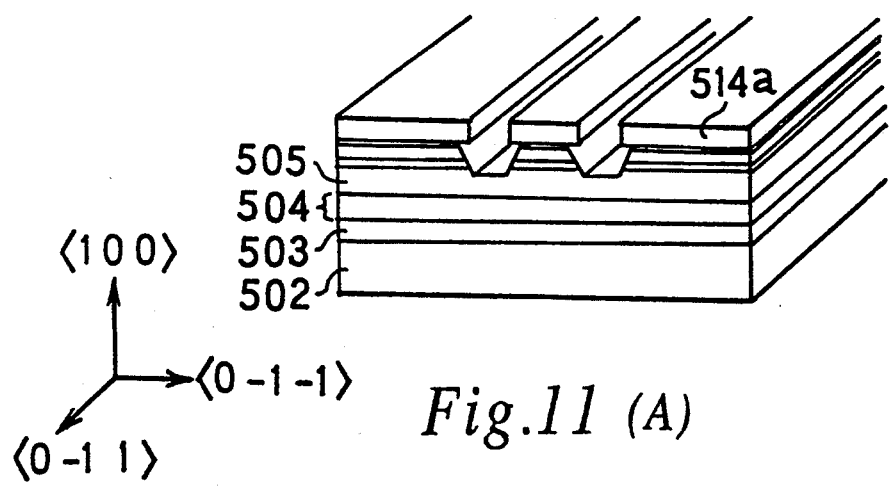
FIG. 11(A) is a perspective view showing a main production process of the sixth embodiment of the LED array 501.
FIGS. 11(B)–11(F) are side sectional views each showing a main production process of the sixth embodiment of the LED array.
Figure 11:
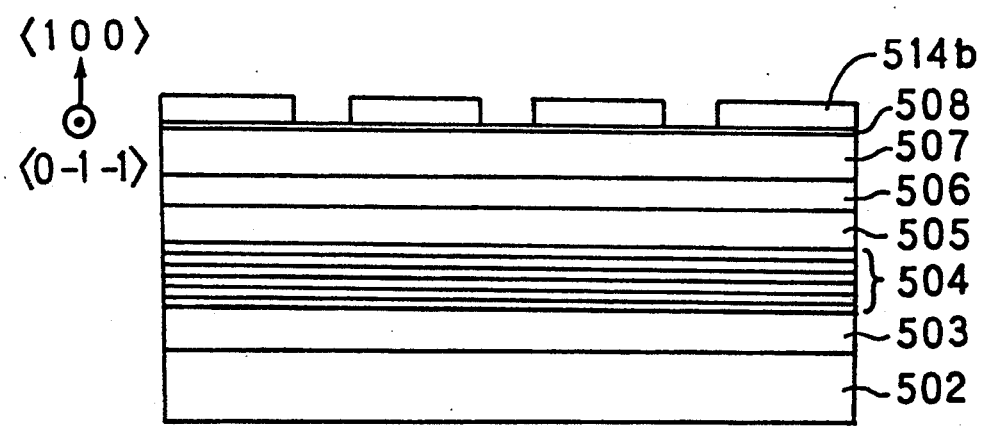
Figure 11:
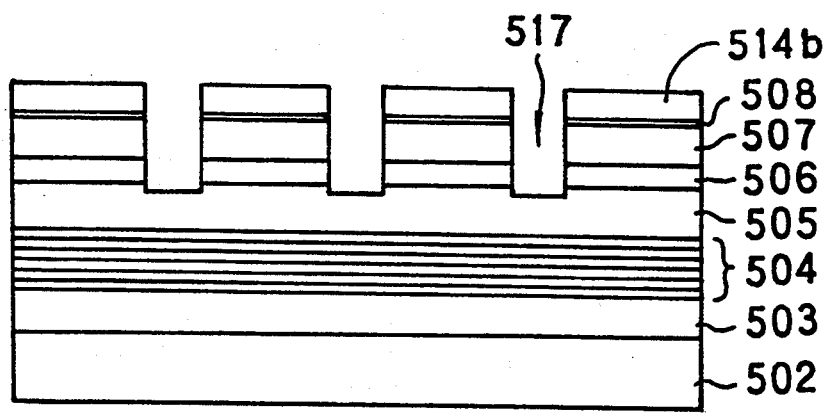
Figure 11:
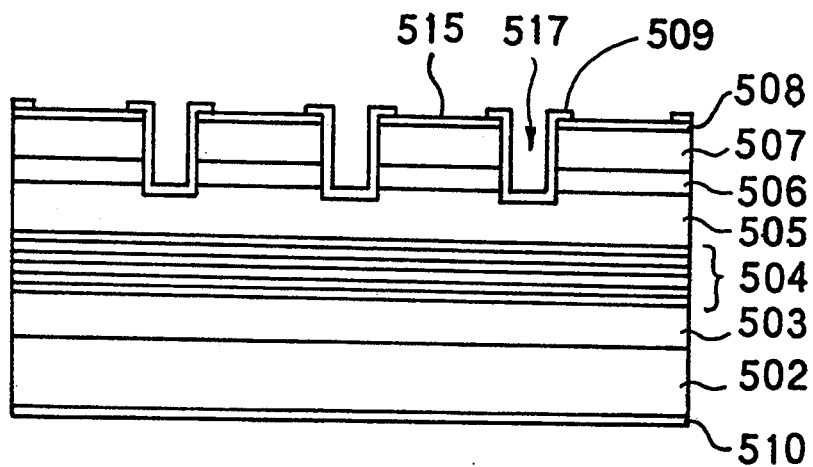
Figure 11:
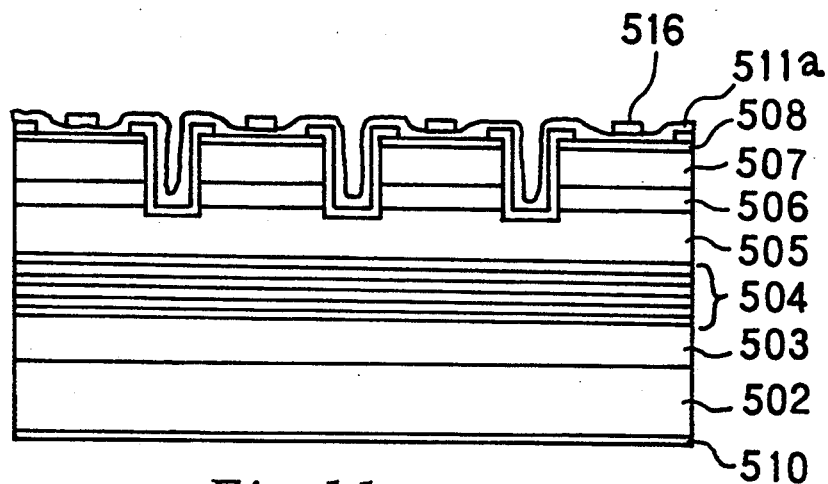
Figure 11:
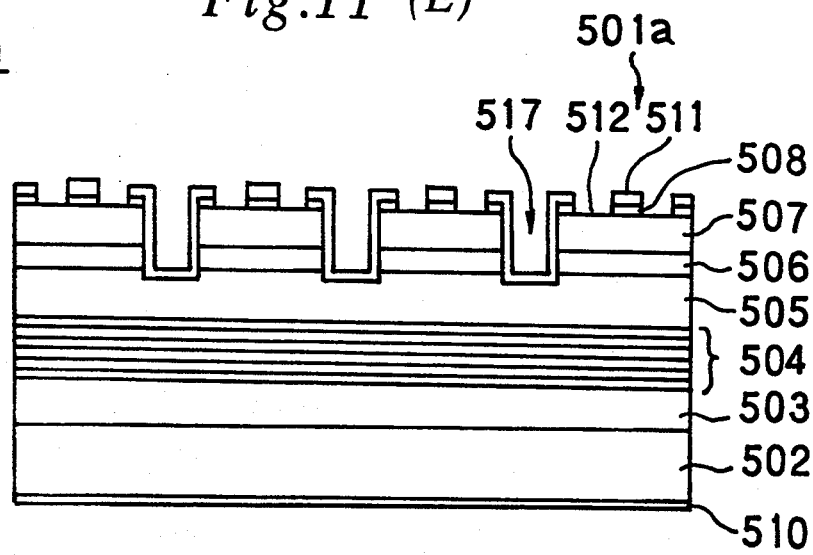

The isolating mesa groove 517 having the vertical wall is produced by changing the production processes of the first embodiment shown in FIGS. 2(B)–2(E) as follows:

FIG. 11(A) is a perspective view showing a main production process of the sixth embodiment of the LED array 501.

FIGS. 11(B)–11(F) are side sectional views each showing a main production process of the sixth embodiment of the LED array.

Next, a description is given to the production method of the LED array 1 referring to FIGS. 11(A)–11(F).

At first, the same layers as those of the sixth embodiment shown in FIG. 10 are provided as shown in FIG. 11(A).

Next, as shown in FIG. 11(A), a photo-resist pattern layer 514a is formed on the p-type GaAs cap layer 508 of the stacked wafer so that an array direction of the LED array 501 becomes parallel to the <0 −1 1> crystal axis. Then the stacked wafer is etched so as to have a groove penetrating partially into the n-type $Al_{0.7}Ga_{0.3}As$ clad layer 505 by using a etching liquid of $H_3PO_4 \cdot H_2O_2 \cdot H_2O$ of which volume ratio is, for instance, $H_3PO_4 : H_2O_2 : H_2O = 10:3:5$, thus, the grooves formed in the array direction parallel to the <0 −1 1> axis become positive-type mesa grooves as shown in FIG. 11(A).

It should be noted that the abovementioned grooves become a positive-type etched grooves when a etching liquid other than the $H_3PO_4 \cdot H_2O_2 \cdot H_2O$ is used.

Next, in order to obtain the isolating mesa grooves 517, a photo-resist pattern 514b is again deposited thereon as shown in FIG. 11(B).

Then, the stacked wafer is etched by the plasma etching using $Cl_2$ gas, thus, the isolating mesa grooves 517 having the vertical walls are obtained as shown in FIG. 11(C).

Next, as shown in FIG. 11(D), after removing the photoresist 514b, an insulation layer 509 of SiN is formed on the etched surface and the cap layer 508 so as to have a thickness of 0.1 μm, then a contact hole 515 is provided on the cap layer 508 of each of the LEDs 501a shown in FIG. 11(F) by removing a part of the insulation layer 509 by a plasma etching method.

Next, as shown in FIG. 11(E), after an Al layer 511a (Al electrode 511) is formed thereon so as to have a thickness of 0.5 μm by the vacuum evaporation method, a photo-resist layer 516 having electrode pattern is formed on the Al layer 511a. Then, p-type Al electrodes 511, each led outside across the positive-type groove provided in the direction of the LED array 501 therein, are obtained by plasma-etching the Al layer 511 and the cap layer 508 using $Cl_2$ gas and by removing the photo-resist layer 516 after the plasma etching.

Next, as shown in FIG. 11(F), after grinding a bottom of the substrate crystal 502, an n-type electrode 510 is formed thereon so as to have a thickness of 0.5 μm by evaporating an AuGeNi alloy. Thus, the LED array 501 shown in FIG. 10 as well as in FIG. 11(F) is obtained.

In this embodiment, it is possible to fabricate an LED array having a high integration because a distance between the LEDs 501a can be narrowed when the isolating mesa grooves 517 having vertical walls are provided.

Seventh embodiment of the LED array

Figure 12:
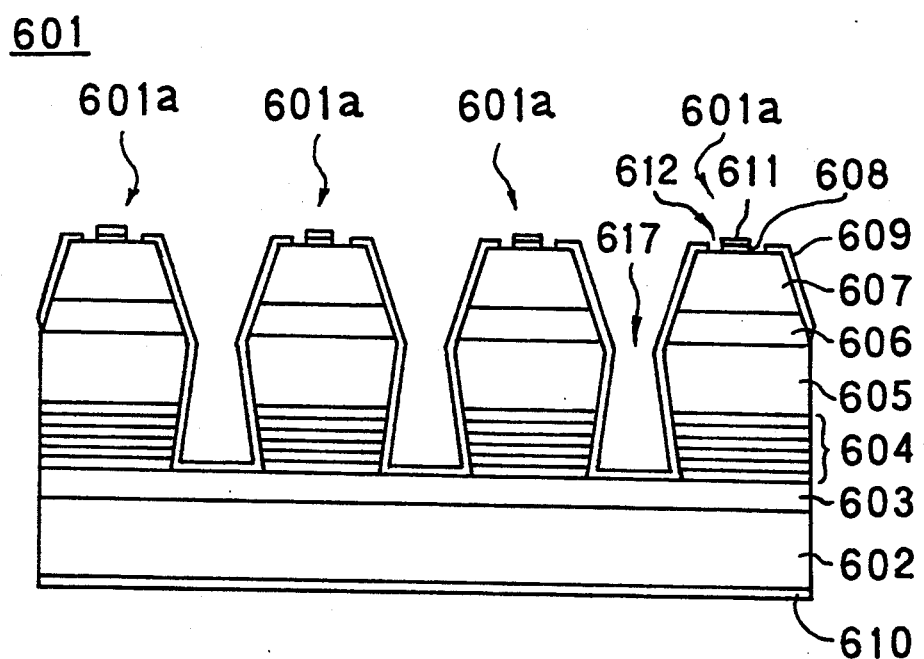
FIG. 12 is a side sectional view showing a seventh embodiment of an LED array of the present invention.

Next, a description is given to a seventh embodiment of an LED array 601 referring to FIG. 12.

FIG. 12 is a side sectional view showing a seventh embodiment of an LED array of the present invention.

A feature of the seventh embodiment of the LED array 601 is that the isolating mesa groove 17 of the LED array 1 of the first embodiment is further extended to a boundary surface between the reflecting layer 4 and the substrate crystal 2 (or the buffer layer 5) of the first embodiment.

Referring to FIG. 12, isolating mesa grooves 617 of the seventh embodiment are provided so as to reach a boundary surface between the reflecting multilayer 604 and the buffer layer 603, wherein a numeral 602 designates an n-type GaAs substrate crystal, 603 an n-type GaAs buffer layer, 604 a reflecting multilayer, 605 an n-type $Al_{0.7}Ga_{0.3}As$ clad layer, 606 a p-type $Al_{0.3}Ga_{0.7}As$ GaAs light emitting layer, 607 a p-type $Al_{0.7}Ga_{0.3}As$ clad layer, 608 a p-type GaAs cap layer, and 610, 611, electrodes.

The each of the isolating mesa grooves 617 is obtained by etching the stacked wafer until the isolating mesa groove 617 (17) reaches the boundary surface between the reflecting multilayer 604 and the buffer layer 603 through the n-type $Al_{0.7}Ga_{0.3}As$ clad layer 605 and the reflecting layer 604 in the etching process of the first embodiment shown in FIG. 2(B).

The n-type GaAs buffer layer 603 (the substrate crystal 602), however, is not etched because the composition thereof is different from the others.

Thus, the isolating mesa grooves 617 have uniform depths, so that each of the LEDs has an uniform and high light emitting output.

What is claimed is:

1. A light emitting diode array comprising:
   a substrate crystal made of a first conductivity-type semi-conductor;
   a plurality of light emitting diodes aligned in row on the substrate crystal, each of the light emitting diodes having a light output surface from which a light is emitted outside, and being isolated with isolating mesa grooves, and having a double hetero-structure formed by causing a light emitting layer having a forbidden band width to be interposed between a first semi-conductor layer of said first conductivity-type and a second semi-conductor layer of a second conductivity-type; and
   a reflecting layer provided between the substrate crystal and one of said first and second semi-conductor layers, the reflecting layer comprising a plurality of semi-conductive layers having 2 or more different refractive indexes, each of the semi-conductive layers having the same conductivity-type as that of the substrate crystal and having a wider forbidden band width than that of the light emitting layer.

2. A light emitting diode array as claimed in claim 1, wherein a thickness of the double hetero-structure of the light emitting diode is less than 20 μm.

3. A light emitting diode array as claimed in claim 1, wherein a reflection preventing layer is provided on the light output surface, the reflection preventing layer having a maximum transmittance in accordance with a center wavelength of the light emitted from the light emitting layer.

4. A light emitting diode array as claimed in claim 3, wherein the reflection preventing layer comprises a plurality of semi-conductive layers having different kinds of refractive indexes, one of the plurality of the semi-conductive layers having a thickness d defined as $$d = (2m-1) \cdot \lambda p / (4 \cdot n)$$

wherein m: a positive integer, λp: a center wavelength of a light emitted from the light emitting layer, and n: the refractive index of the one of the plurality of the semi-conductive layer.

5. A light emitting diode array as claimed in claim 1, wherein the other of said first and second semi-conductor layers of the double hetero-structure which is provided between the light emitting surface and the light emitting layer, comprises a plurality of semi-conductive layers having different conductivities, at least one of the plurality of semi-conductive layers which are provided on the side of the light emitting surface having a higher conductivity than those of remainders of the plurality of semi-conductive layers.

6. A light emitting diode array as claimed in claim 1, wherein the reflecting layer is made of a multiplexed reflecting multilayer having a plurality of reflecting multilayers each having a different reflective center wavelength, each of the plurality of the multilayers being formed in such a manner that a plurality of semi-conductive layers having 2 or more different refractive indexes are stacked alternately.

7. A light emitting diode array as claimed in claim 6, wherein respective semi-conductor layers of the same refractive index have different thicknesses among said plurality of reflecting multilayers.

8. A light emitting diode array as claimed in claim 1, further comprising parallel grooves extended in parallel with a direction of the light emitting diodes aligned in row, the parallel grooves being defined as positive-type mesa grooves, and the isolating mesa grooves being defined as positive-type mesa grooves.

9. A light emitting diode array as claimed in claim 1, further comprising parallel grooves provided in parallel with a direction of the light emitting diodes aligned in row, the parallel grooves being define as positive-type mesa grooves, and each of the isolating mesa grooves comprising a positive-type groove defined from the top of the light output surface of the light emitting diode array to a p-n junction plane formed between the one of said first and second semi-conductor layers and the light emitting layer, and a negative-type mesa grooves defined in a deeper portion than the p-n junction plane.

10. A light emitting diode array as claimed in claim 1, further comprising parallel grooves provided in parallel with a direction of the light emitting diodes aligned in row, the parallel grooves being defined as positive-type mesa grooves, and each of the isolating mesa grooves having perpendicular walls perpendicular to an upper surface of the substrate crystal.

* * * * *